(12) United States Patent
Okuyama et al.

(10) Patent No.: US 6,404,688 B2
(45) Date of Patent: Jun. 11, 2002

(54) SEMICONDUCTOR MEMORY DEVICE HAVING A SELF-REFRESH OPERATION

(75) Inventors: Yoshiaki Okuyama; Yoshitaka Takahashi; Shinya Fujioka; Akihiro Funyu, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/791,839

(22) Filed: Feb. 26, 2001

(30) Foreign Application Priority Data

Feb. 29, 2000 (JP) ........................................ 2000-054883

(51) Int. Cl.$^7$ .................................................. G11C 7/00

(52) U.S. Cl. ...................... 365/222; 365/225.7; 365/236

(58) Field of Search ................................. 365/222, 201, 365/191, 189.05, 225.7, 233, 236

(56) References Cited

U.S. PATENT DOCUMENTS

| | | | | | |
|---|---|---|---|---|---|
| 5,243,576 | A | * | 9/1993 | Ishikawa | 365/222 |
| 5,636,171 | A | * | 6/1997 | Yoo et al. | 365/222 |
| 5,703,823 | A | * | 12/1997 | Douse et al. | 365/222 |
| 6,023,440 | A | * | 2/2000 | Kotani et al. | 365/230.03 |

* cited by examiner

Primary Examiner—David Nelms
Assistant Examiner—Thong Le
(74) Attorney, Agent, or Firm—Arent Fox Kintner Plotkin & Kahn, PLLC

(57) ABSTRACT

A semiconductor memory device having a self-refresh operation includes a first circuit generating a first signal that specifies a first self-refresh cycle by a non-volatile circuit element provided in the semiconductor memory device, a second circuit receiving a second signal that specifies a second self-refresh cycle via a terminal that is used in common to another signal, and a third circuit generating a pulse signal having one of the first and second self-refresh cycles, the pulse signal being related to the self-refresh operation.

10 Claims, 8 Drawing Sheets

FIG.5

| FREQUENCY DIVIDING RATIO | OUTPUT OF SELECTOR CIRCUIT | | | | | | |
|---|---|---|---|---|---|---|---|
| | $15_0$ | $15_1$ | $15_2$ | $15_3$ | $15_4$ | $15_5$ | $15_6$ |
| 1 | H | H | H | H | H | H | H |
| 2 | L | H | H | H | H | H | H |
| 3 | H | L | H | H | H | H | H |
| 4 | L | L | H | H | H | H | H |
| ⋮ | | | | ⋮ | | | |
| 24 | L | L | L | H | L | H | H |
| 25 | H | H | H | L | L | H | H |
| 26 | L | H | H | L | L | H | H |
| ⋮ | | | | ⋮ | | | |
| 127 | H | L | L | L | L | L | L |
| 128 | L | L | L | L | L | L | L |

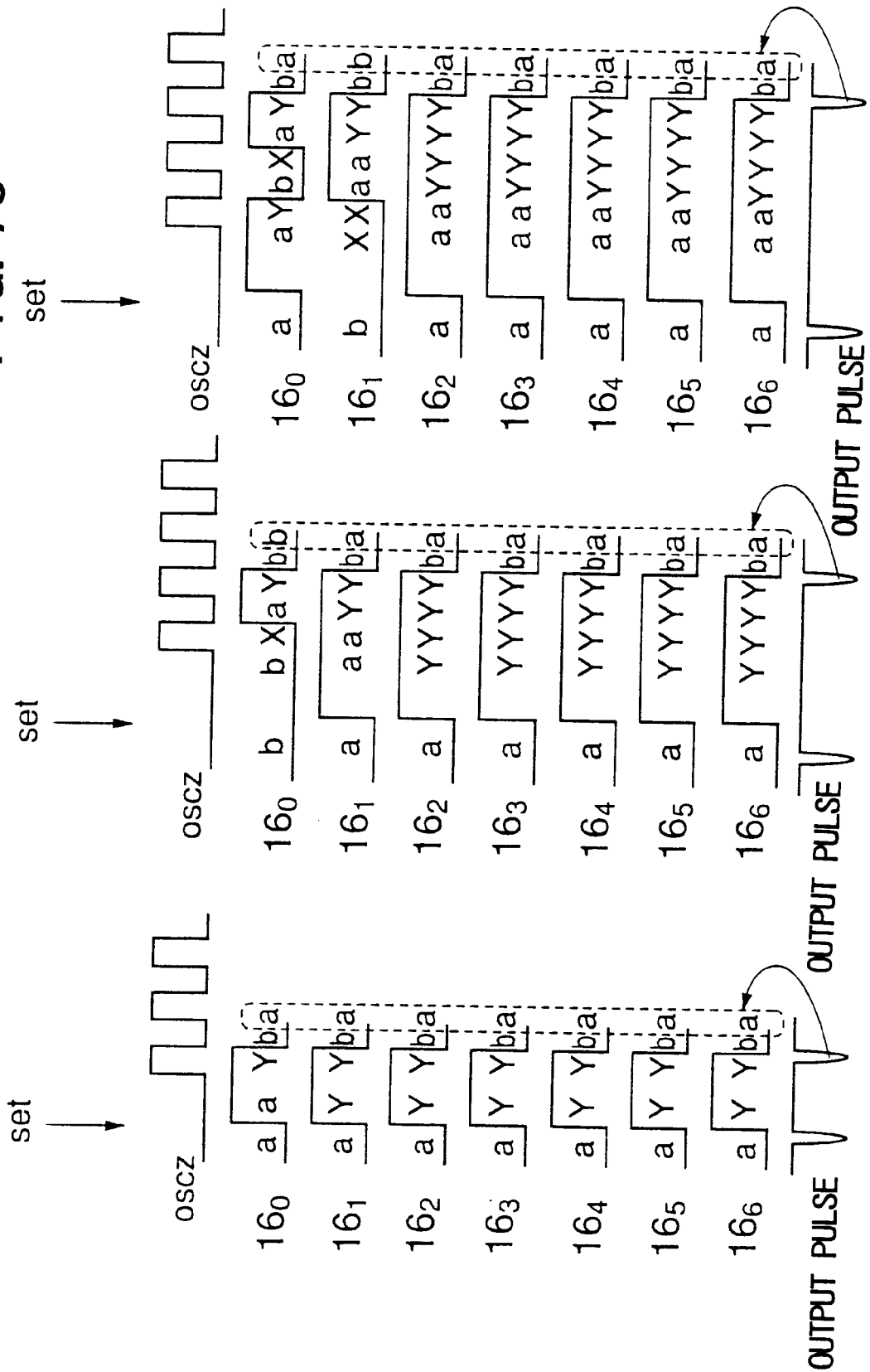

SEMICONDUCTOR MEMORY DEVICE HAVING A SELF-REFRESH OPERATION

BACKGROUND OF THE INVENTION

1. Field of the Invention

The present invention generally relates to semiconductor memory devices, and more particularly, to a semiconductor memory device of a DRAM (Dynamic Random Access Memory) type in which a self-refresh operation is constantly performed within the memory device.

2. Description of the Related Art

Recently, a compact mobile terminal such as a cellular phone has collaborated with the Internet and handled a large amount of data. This has stimulated a large-capacity memory. Nowadays, an SRAM (Static Random Access Memory) is employed in the cellular phones because of its low power consumption. However, the SRAM does not have a high integration density. The larger the SRAM capacity, the more expensive the cost. In contrast, the DRAM is a low-cost, high-capacity memory. The DRAM and SRAM do not have different command systems. This does not allow the SRAM to be simply interchanged with the DRAM. In this case, a major problem arises from a refresh operation of the DRAM. Data stored in memory cells of the DRAM will be lost unless the DRAM is periodically refreshed. The periodic refresh can be implemented by supplying a refresh command to the DRAM from a controller provided outside of the DRAM. However, this would apply a considerable load to the controller. This needs a periodic refresh that is spontaneously performed within the DRAM. Such a periodic refresh is called self-refresh.

Conventionally, the refresh operation is performed at intervals that are set by means of fuses provided within the DRAM. The cycle of self-refresh is selected so that power consumption can be minimized at the time of self-refresh. If the cycle of the self-refresh does not have the optimal value, power will be uselessly consumed. The cycle defined by the fuses is fixed and cannot be changed. The cycle of the self-refresh is no longer changed after the settings of fuses.

A semiconductor memory device directed to overcoming the above drawback has been proposed in Japanese Laid-Open Patent Application No. 8-315569. In this proposal, a mode register is substituted for fuses. Information about the cycle of the self-refresh can be externally written into a timer for use in self-refresh. There is another proposal disclosed in Japanese Laid-Open Patent Application No. 11-345486. According to this proposal, an exclusively used pin is provided to which a control signal for controlling the cycle of the self-refresh is externally applied. The control signal adjusts the cycle of self-refresh defined by the setting of fuses provided in the memory device.

However, Japanese Laid-Open Patent Application No. 8-315569 does not meet a requirement of changing the cycle of the self-refresh in the semiconductor memory device equipped with the fuses. Japanese Laid-Open Patent Application No. 11-345486 meets a requirement of changing the cycle of the self-refresh, but needs an increased chip area for providing the exclusively used pin to which the control signal is applied.

SUMMARY OF THE INVENTION

It is a general object of the present invention to provide a semiconductor memory device in which the above disadvantages are eliminated.

A more specific object of the present invention is to provide a semiconductor memory device capable of changing the cycle of self-refresh from the outside of the device without increasing the chip area although the device employs fuses.

The above objects of the present invention are achieved by a semiconductor memory device having a self-refresh operation comprising:

a first circuit generating a first signal that specifies a first self-refresh cycle by a non-volatile circuit element provided in the semiconductor memory device; a second circuit receiving a second signal that specifies a second self-refresh cycle via a terminal that is used in common to another signal; and a third circuit generating a pulse signal having one of the first and second self-refresh cycles, the pulse signal being related to the self-refresh operation.

BRIEF DESCRIPTION OF THE INVENTION

Other objects, features and advantages of the present invention will become more apparent from the following detailed description when read in conjunction with the accompanying drawings, in which:

FIG. 5 illustrates a relationship between count value data supplied to a counter and a frequency dividing ratio;

FIGS. 7A, 7B and 7C are timing charts of the counter; and

DESCRIPTION OF THE PREFERRED EMBODIMENTS

Figure 1:
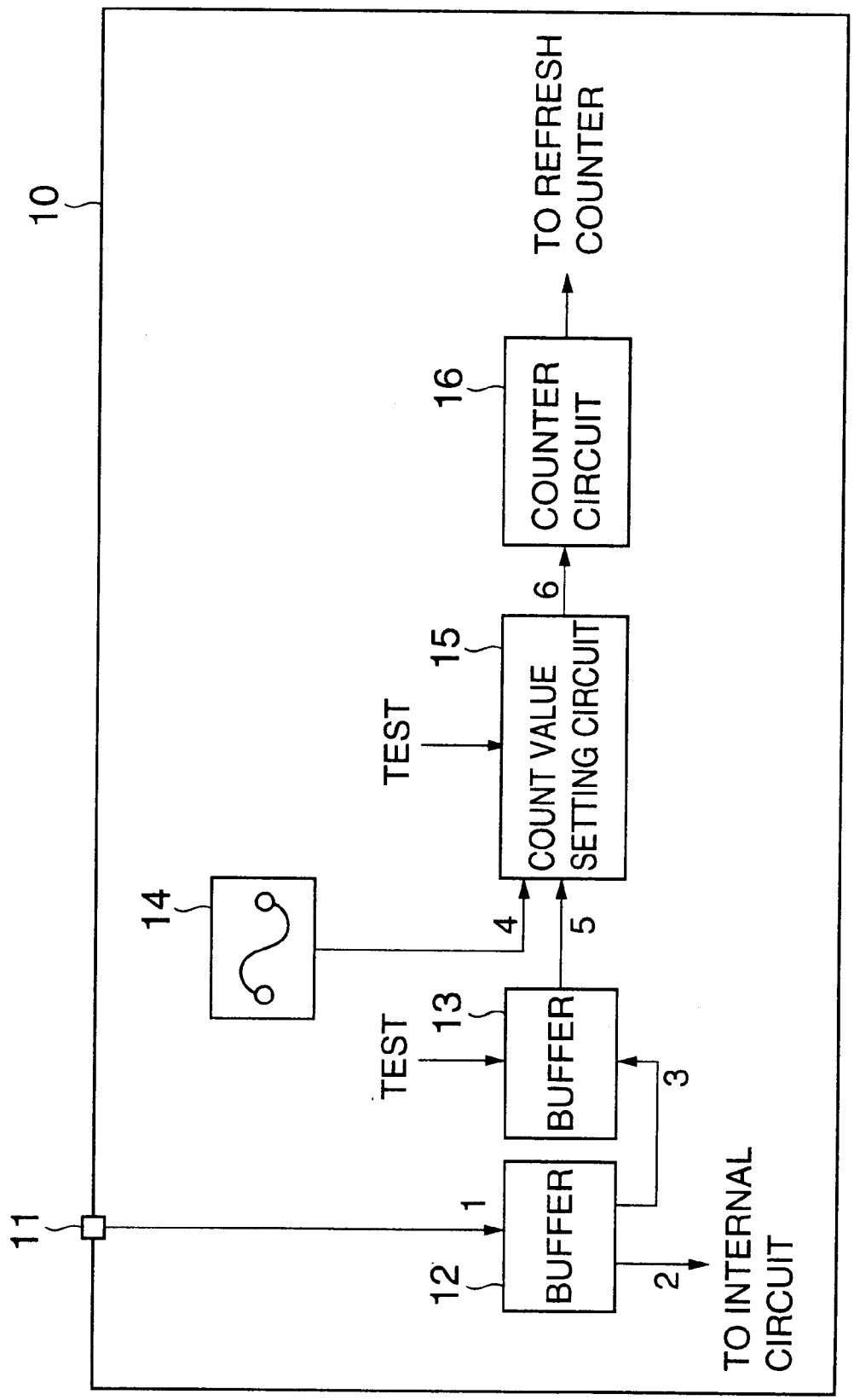
FIG. 1 is a block diagram of a semiconductor memory device according to an embodiment of the present invention.

FIG. 1 is a block diagram of a semiconductor memory device according to an embodiment of the present invention.

A semiconductor memory device 10 shown in FIG. 1 includes an address input terminal 11, buffer circuits 12 and 13, a fuse circuit 14, a count value setting circuit 15, and a counter circuit 16. An external address signal 1 is applied to the buffer circuit 12 via the address terminal 11. The address terminal 11 may be provided so as to outwardly extend from a package of the device. The address signal that has passed through the buffer circuit 11 is supplied to an internal circuit (not shown) as an address signal 2. A part of the address signal 1 is output to the buffer circuit 13 as an address signal 3. The address signal 3 forms data indicative of a count value that is to be set in the count value setting circuit 15. The count value corresponds to the cycle of self-refresh.

The buffer circuit 13 is set to an active state or an inactive state in accordance with a test signal TEST supplied from the outside of the device. The buffer circuit 13 is normally in the inactive state, and does not output the address signal 3 to the count value setting circuit 15. When the buffer circuit 13 is supplied with the test signal TEST, the circuit 13 is switched to the active state (test mode). Then, the buffer circuit 13 outputs the address signal 3 to the count value setting circuit 15 as a cycle setting circuit 5.

The fuse circuit 14 includes fuses, and outputs a count value to be set in the count value setting circuit 15 to the circuit 15 as a cycle setting signal 4.

The count value setting circuit 15 maintains a count value that the counter circuit 16 should count. The count value setting circuit 15 receives the test signal TEST externally supplied. The count value setting circuit 15 normally selects the cycle setting signal 4 from the fuse circuit 14, and supplies it to the counter circuit 16. Upon receipt of the test signal TEST, the count value setting circuit 15 is switched to the test mode, and the cycle setting signal 5 from the buffer circuit 13 is selected and output to the counter circuit 16. When the count value of the counter circuit 16 reaches the setting count value, the counter circuit 16 supplies a pulse to a refresh counter, which is not illustrated in FIG. 1 for the sake of simplicity.

With the above structure, it is possible to arbitrarily set the self-refresh cycle by using the existing address terminal without increasing the chip area in addition to the setting of the cycle defined by the fuse circuit 14.

In short, the semiconductor memory device 10 has a self-refresh operation and includes the fuse circuit 14 serving as a first circuit, a second circuit composed of the buffer circuits 12 and 13, and a third circuit composed of the circuits 15 and 16. The first circuit generates a first signal that specifies a first self-refresh cycle by a non-volatile circuit element provided in the semiconductor memory device. The second circuit receives a second signal that specifies a second self-refresh cycle via the terminal 11 that is used in common to another signal such as the address signal. The third circuit generates a pulse signal having one of the first and second self-refresh cycles, the pulse signal being related to the self-refresh operation.

The terminal 11 that is originally used for the address signal is commonly used to externally receive the signal for arbitrarily controlling the self-refresh cycle. Thus, it is possible to increase the chip area.

Figure 2:
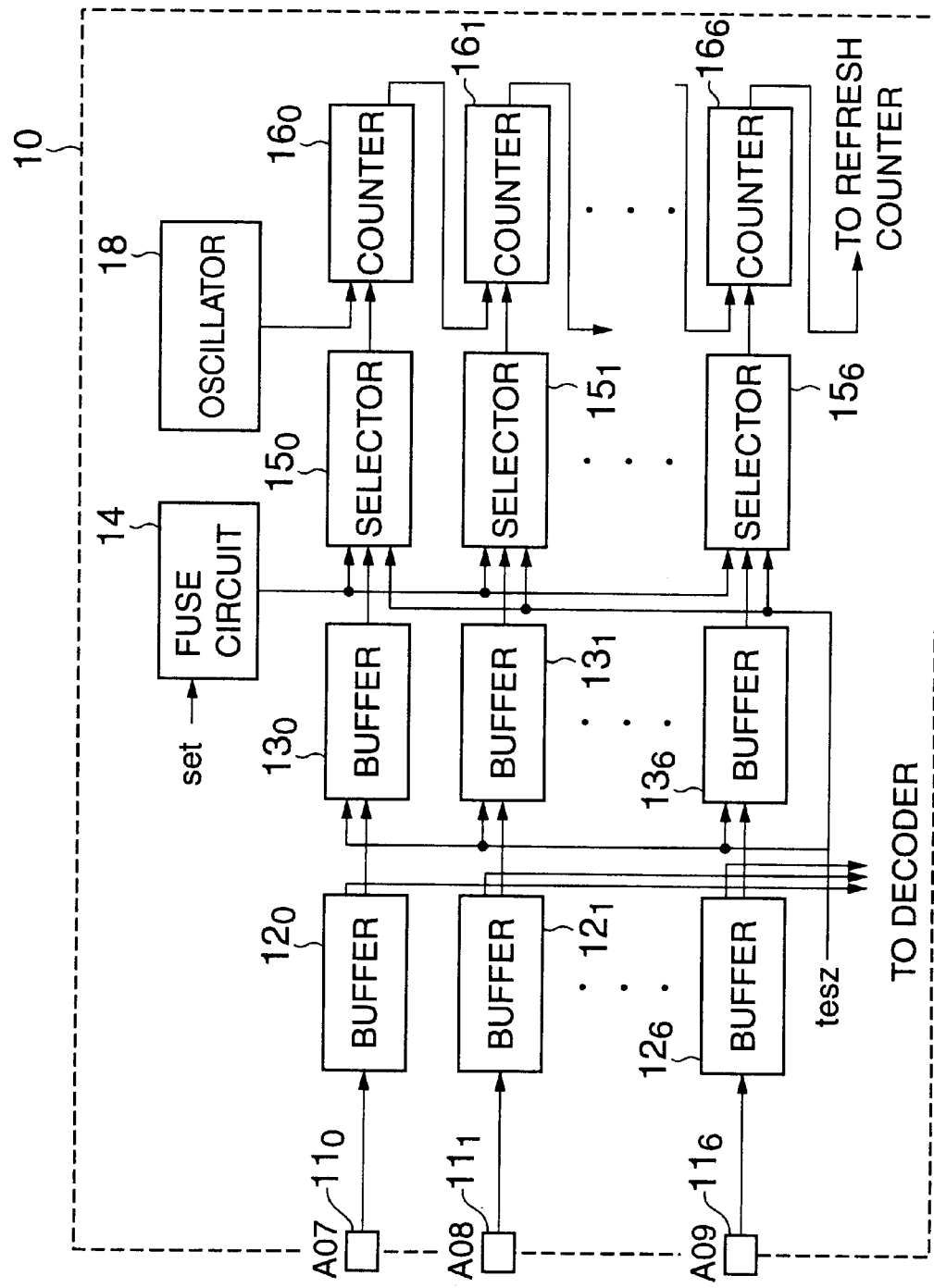
FIG. 2 is a block diagram of a configuration of the device shown in FIG. 1.

FIG. 2 is a block diagram of the structure shown in FIG. 1 in more detail. The address terminal 11, which receives the address signal, includes address terminals $11_0$–$11_6$. The address terminals $11_0$–$11_6$ respectively receive address bits A07 through A10 and A17–A19 among given address bits. The address bits A07–A10 and A17–A19 indicate the count value that is to be set in the count value setting circuit 15. The address bits A07–A10 and A17–A19 are also supplied via buffers $12_0$–$12_6$ to a decoder that will be described later and to buffers $13_0$–$13_6$ forming the buffer circuit 13. The buffers $13_0$–$13_6$ do not capture the signals from the buffers $12_0$–$12_6$ when a test signal tesz (that corresponds to the test signal TEST in FIG. 1) is OFF (in the inactive state), but capture the signals from the buffers $12_0$–$12_6$ when the test signal tesz is ON.

The count value setting circuit 15 includes selector circuits $15_0$–$15_6$. The selector circuits $15_0$–$15_6$ select either the count value data from the fuse circuit 14 or count value data from the buffers $13_0$–$13_6$. The count value data from the fuse circuit 14 are to be set in the count value setting circuit 15. The selected count value data are output to counter $16_0$–$16_6$ of the counter circuit 16.

Figure 3:
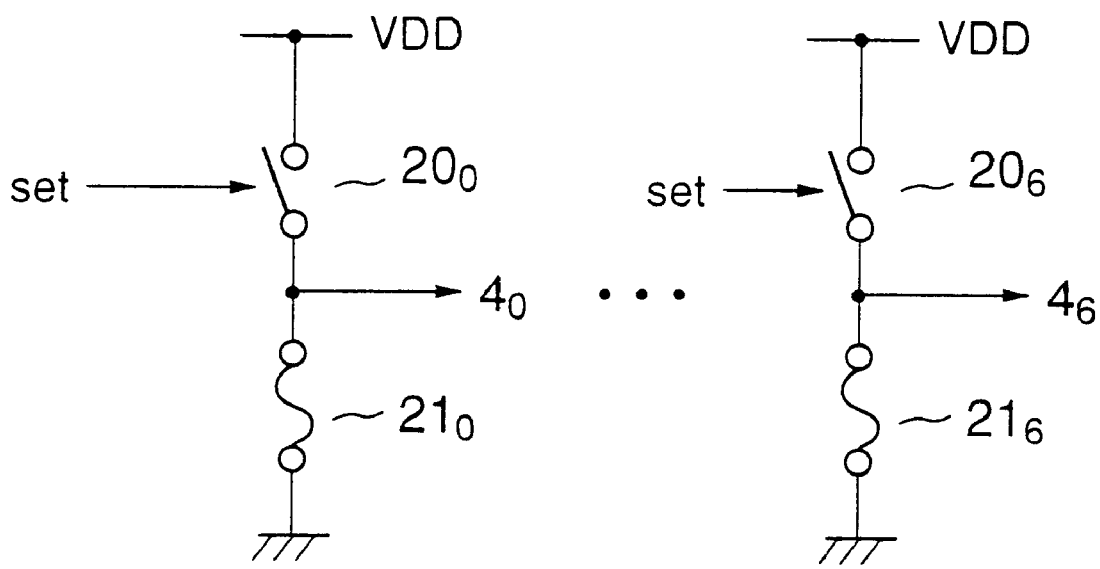
FIG. 3 is a circuit diagram of a fuse circuit shown in FIGS. 1 and 2.

FIG. 3 is a circuit diagram of a configuration of the fuse circuit 14. The fuse circuit 14 includes switches $20_0$–$20_6$ and fuses $21_1$–$21_6$. One switch and one fuse form a unit circuit. Each of the unit circuits is associated with a respective one of the selector circuits $15_0$–$15_6$. The unit circuits output count value data $4_0$–$4_6$, which form the aforementioned cycle setting signal 4. For example, the unit circuit made up of the switch $20_0$ and the fuse $21_0$ outputs count value data $4_0$. Each of the switches $20_0$–$20_6$ is turned ON when receiving a common set signal set. In this case, if the corresponding fuse has not been disconnected, the output of the unit circuit is at a low (L) level. In contrast, if the fuse has been disconnected, the output of the unit circuit is at a high (H) level. The fuses $21_1$–$21_6$ may be replaced by other arbitrary non-volatile circuit elements such as ROM.

Turning to FIG. 2 again, the counters $16_0$–$16_6$ forming the counter 16 are cascaded. The counter $16_0$ receives a clock from an oscillator 18, and the counter $16_6$ forms the output signal of the counter circuit 16. The output signal of the counter circuit 16 is applied to a refresh counter, which will be described later. The counters $16_0$–$16_6$ operate in accordance with the count value data from the selector circuits $15_0$–$15_6$, respectively. The count operations of the counters $16_0$–$16_6$ are controlled based on whether the count value data from the selector circuits $15_0$–$15_6$ are H or L.

FIG. 5 shows a relationship between the outputs of the selector circuits $15_0$–$15_6$ and the frequency dividing ratio. When H data are applied to all the counters $16_0$–$16_6$, the frequency dividing ratio is equal to 1. When L data are applied to all the counters $16_0$–$16_6$, the frequency dividing ratio is equal to 128 ($=2^7$). The configuration and operation of the counter circuit 16 will be described in detail later.

Figure 4A:
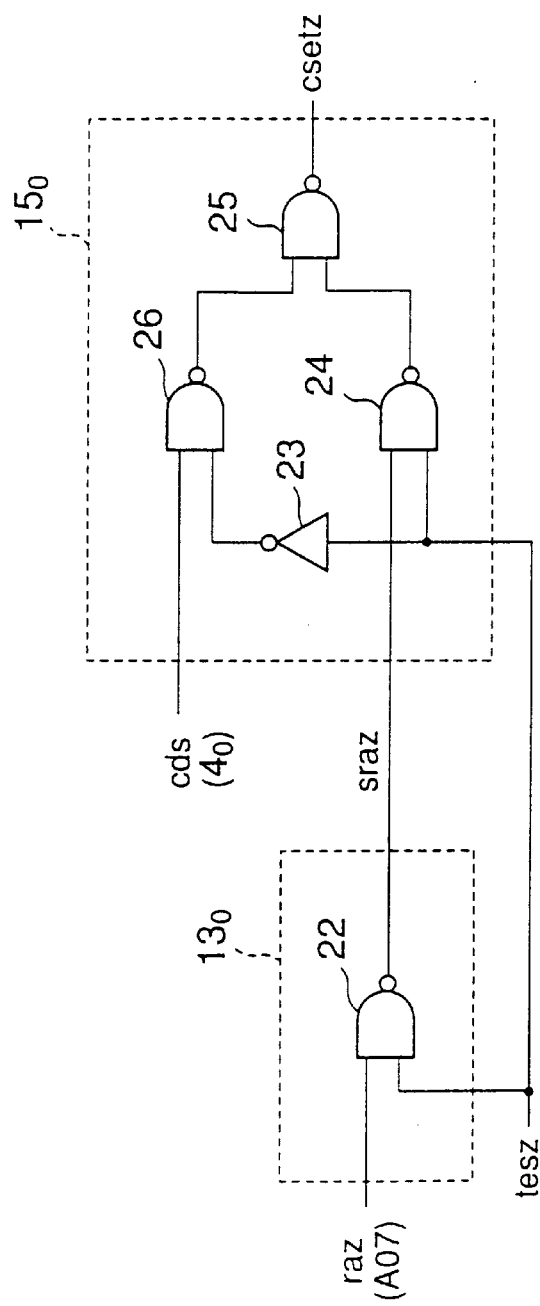
FIG. 4A is a circuit diagram of a buffer and a selector circuit shown in FIG. 2.
Figure 4B:
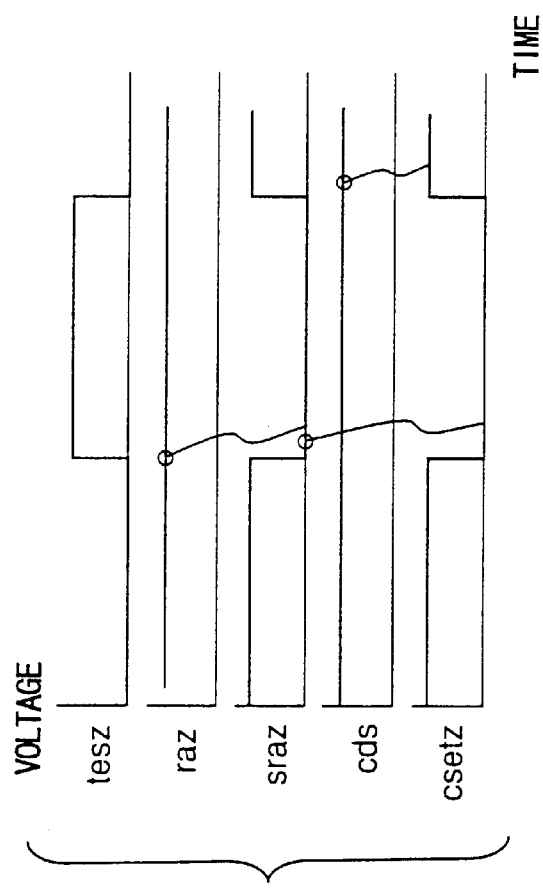
FIG. 4B is a timing chart of an operation of the circuit shown in FIG. 4A.

FIG. 4A is a circuit diagram of a configuration of the buffer $13_0$ and the selector circuit $15_0$. The buffer $13_0$ includes a NAND gate 22. The NAND gate 22 receives the address bit A07 (also referred to as "raz") via one input terminal and receives the test signal tesz via the other input terminal. As shown in FIG. 4B, when the test signal tesz is at L, the NAND gate 22 blocks the input signal raz. When the test signal tesz is at H, the NAND gate 22 inverts the input signal raz. An output signal sraz of the buffer $13_0$ is output to the corresponding selector circuit $15_0$ of the count value setting circuit 15.

The selector circuit $15_0$ includes an inverter 24, NAND gates 24, 25 and 26. The test signal tesz is applied directly to the NAND gate 24, and is applied to the NAND gate 26 via the inverter 23. The NAND gate 24 receives the output signal sraz of the buffer $13_0$, and the NAND gate 26 receives a corresponding output signal cds (count value data $4_0$) of the buffer $13_0$. The output signals of the NAND gates 24 and 26 are applied to the NAND gate 25. An output signal csetz of the NAND gate 25 is output to the counter $16_0$. As shown in FIG. 4(B), when the test signal tesz is at L, the output signal csetz is the signal cds from the fuse circuit 14. In contrast, when the test signal tesz is at H, the output signal csetz is the signal sraz from the buffer $13_0$.

Normally, when the test signal tesz is at L, the counter $16_0$ operates in accordance with the count value data defined by the fuse circuit 14. In contrast, when the test signal tesz is at H, the counter $16_0$ operates in accordance with the count value data that is externally set. The other buffers $13_1$–$13_6$ and the selector circuits $15_1$–$15_6$ have the same configurations as the buffer $13_0$ and the selector circuit $15_0$. The other counters $16_1$–$16_6$ operates in the same manner as the counter $16_0$.

Figure 6B:
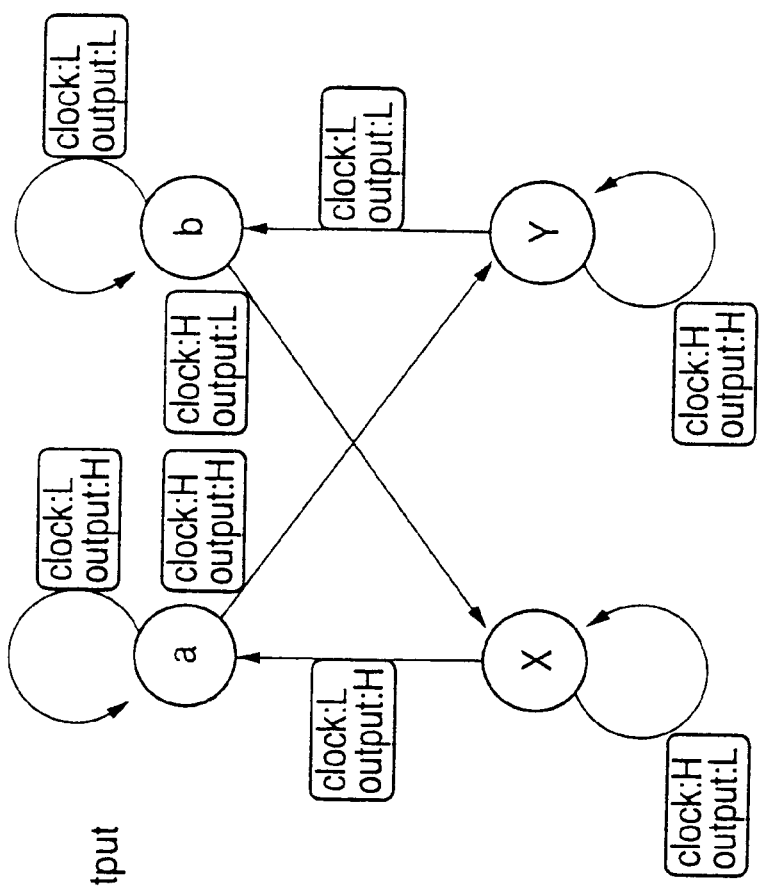
FIG. 6B is a state transition diagram of the counter.
Figure 6A:
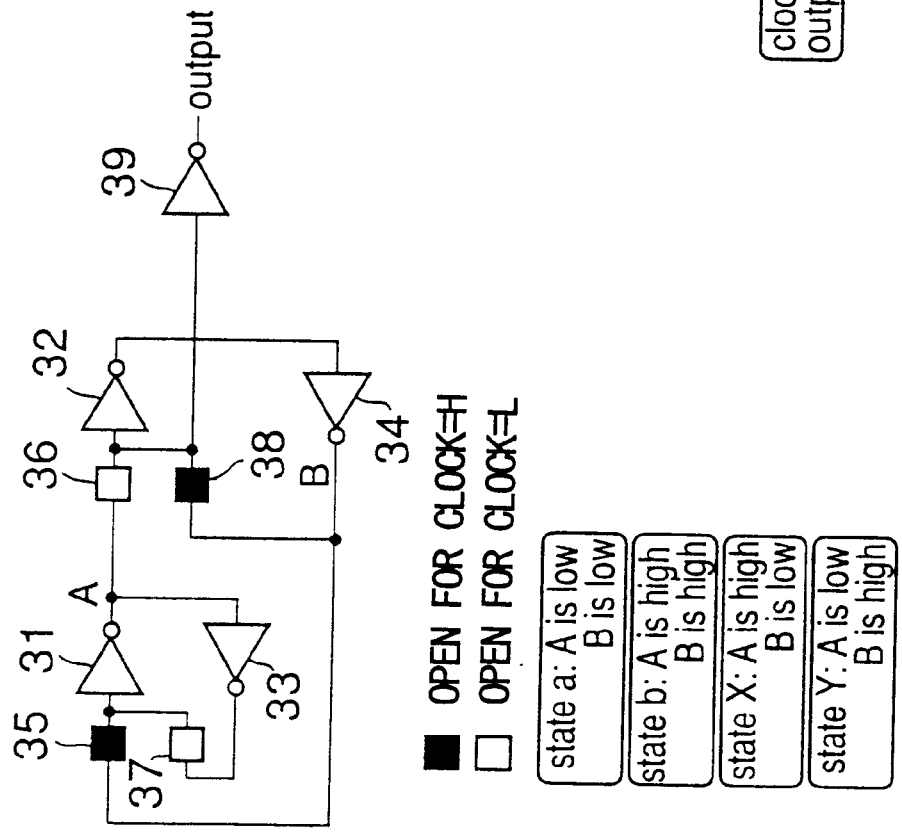
FIG. 6A is a circuit diagram of a configuration of the counter.

FIG. 6A is a circuit diagram of the counters $16_0$–$16_6$. Each of the counters $16_0$–$16_6$ is made up of inverters 31–34, switches 35–38 and an inverter 39. Each counter has four states "a", "b", "X" and "Y", which are defined by the combination of the levels of nodes A and B. The state "a" is defined for A=B=L. The state "b" is defined for A=B=H. The state "X" is defined for A=H and B=L. The state "Y" is defined for A=L and B=H. The states of each counter is defined by turning ON/OFF the switches 35–38 by the respective input clocks (the clock from the oscillator 18 for the counter 16₀). The initial states (initial output levels) of the buffers 31–34 are defined by H/L count value data from the count value setting circuit 15. The signal that has passed through the switch 38 passes through the buffer 39 and serves as the output signal of the counter.

FIG. 6B is a state transition diagram showing state transitions of each counter. For example, when the output of the counter (the output of the inverter 39) is at H in the state "a", the counter remains in the state "a" if the clock is at L. When the output of the counter is at H in the state "a", the output remains at H and the counter changes to the state "Y" if the clock is at H.

FIGS. 7A through 7C show operations of the counter circuit 16. More particularly, FIG. 7A shows an operation of the counter circuit 16 for a frequency dividing ratio of 1. FIG. 7B shows an operation of the counter circuit 16 for a frequency dividing ratio of 2. FIG. 7C shows an operation of the counter circuit 16 for a frequency dividing ratio of 3. In the case of FIG. 7A, all the counters 16₀–16₆ are in the state "a", and operate as shown. If the counter 16₆ changes from the state "Y" to the state "b", its output changes from H to L. In the case of FIG. 7A, all the counters 16₀–16₆ change from the state "Y" to the state "b". Although not illustrated for the sake of simplicity, the output signal of the counter 16₆ is supplied to the counters 16₀–16₆ as a set signal. When all the counters 16₀–16₆ change from H to L, these counters return to the respective initial states (state "a").

For a frequency dividing ratio of 3 shown in FIG. 7B, only the counter 16₀ is set to the state "b", and the remaining counters 16₁–16₆ are set to the state "a". The states of the counters 16₀–16₆ change as shown in FIG. 7B. When two cycles of the clock (now labeled "oscz") of the oscillator 16 lapse, the counters 16₀–16₆ change from the state "Y" to the state "b", and the output of the counter 16₆ changes from H to L. In response to this change, the counters 16₀–16₆ return to the respective initial states (state "b" for only counter 16₀).

For a frequency dividing ratio of 2 shown in FIG. 7C, only the counter 16₁ is set to the state "b", and the remaining counters 16₀, and 16₂–16₆ are set to the state "a". The states of the counters 16₀–16₆ change as shown in FIG. 7C. When three cycles of the clock oscz of the oscillator 16 lapse, the counters 16₀–16₆ change from the state "Y" to the state "b", and the output of the counter 16₆ changes from H to L. In response to this change, the counters 16₀–16₆ return to the respective initial states (state "b" for only counter 16₁).

In the above-mentioned manner, the counter circuit 16 outputs the count value that ranges from 0000000 to 1111111 (in binary notation).

Figure 8:
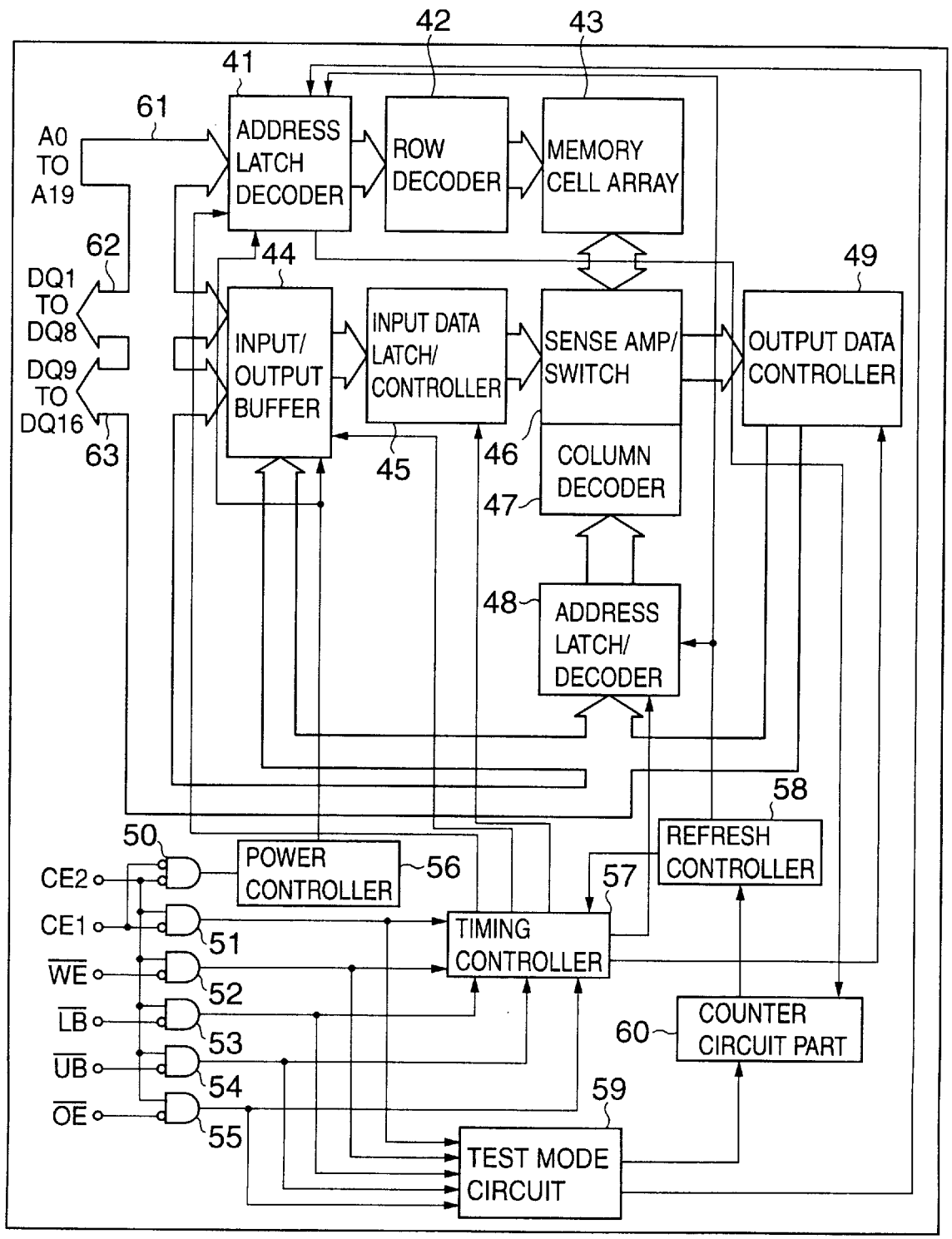
FIG. 8 is a block diagram of a semiconductor memory device according to an embodiment of the present invention.

FIG. 8 is a block diagram of an example of the structure of the semiconductor memory device 10 according to an embodiment of the present invention. The structure shown in FIG. 8 includes the configuration shown in FIG. 1.

The semiconductor memory device 10 includes an address latch/decoder 41, a row decoder 42, a memory cell array 43, an input/output buffer 44, an input latch/controller 45, a sense amplifier/switch 46, a column decoder 47, an address latch/decoder 48, and an output data controller 49. Further, the semiconductor memory device 10 includes gate circuits 50–55, a power controller 56, a timing controller 57, a refresh controller 58, a counter circuit part 60, an address bus 61, and data buses 62 and 63.

The structure shown in FIG. 8 is associated with the circuit shown in FIG. 1 as follows. The buffer circuits 12 and 13 shown in FIG. 1 are included in either the address latch/decoder 41 or 48 or both. This relationship depends on whether the address bits forming the count value data are related to the row address or the column address. The fuse circuit 14, the count value setting circuit 15 and the counter circuit 16 shown in FIG. 1 is included in the counter circuit part 60 shown in FIG. 8. The test mode circuit 59 generates the test signal TEST shown in FIG. 1. The internal circuit shown in FIG. 1 corresponds to the row decoder 42 or the column decoder 48 shown in FIG. 8. When receiving the test signal tesz from the test mode circuit 59, the counter circuit part 60 receives the give address bits from the address latch/decoders 41 and 48, and supplies the refresh controller 58 with the aforementioned count value, so that the cycle of the self-refresh is specified. If the test signal tesz is not output, the counter circuit part 60 receives the count value data from the fuse circuit 14, and notifies the refresh controller 58 of the self-refresh cycle.

The address bits A0–A19 are supplied to the address latch/decoders 41 and 48 over the address bus 61. The address latch/decoders 41 and 48 latch and decode (predecode) the row and column addresses, and supply the row decoder 42 and the column decoder 47 with the predecoded address signals. The row decoder 42 decodes the predecoded row address to thereby select the specified one of the word lines in the memory cell array 43. The column decoder 47 decodes the predecoded column address to thereby drive the sense amplifier/switch 46, so that a specified one of the columns can be selected. Data that is read on a bit line in the memory cell array 43 is output to the input/output buffer 44 via the sense amplifier/switch 46 and the output data controller 49. Then, the data can be output to the outside of the device via the data bus 62 (data DQ1–DQ8) and the data bus 63 (DQ9–DQ16). Write data is transferred over the data buses 62 and 63, and is written into the memory cell array 43 via the input/output buffer 44, the input latch/controller 45 and the sense amplifier/switch 46.

The gates 50–55 receive various control signals. More particularly, the gates 50 and 51 receive chip enable signals CE1 and CE2 (these signals are identical to each other). The chip enable signal CE2 is supplied to the gates 52–55. The gate 53 receives a write enable signal /WE. The gates 53 and 54 receive a data mask signal /LB (that masks lower bits) and a data mask signal /UB (that masks high bits), respectively. The gate 55 receives an output enable signal/OE.

The test mode circuit 59 decodes the output signals of the gates 51–55, and produce various signals used in the test mode. For example, when the test mode circuit 59 acknowledges that the output signals of the gates 51–55 are at respective given levels, the circuit 59 generates the test signal tesz, which is output to the counter circuit part 60. The test signal generated by the test mode circuit 59 is applied to the address latch/decoder 41, which is thus disabled. In the disabled state, the address latch/decoder 41 does not latch and decode the external address.

The power controller 56 receives the output signal of the gate 50, and disables the address latch/decoder 41 and the input/output buffer 44. This reduces consumption power. The timing controller 57 receives the signals from the gates 51–55 and the refresh controller 58, and produces control signals for defining various timings. For example, the timing controller 57 specifies a data part to be masked on the basis of the signals from the gates 53 and 54, and thus controls the address latch/decoders 41 and 48 and the input data latch/controller 45.

The present application is based on Japanese Priority Application No. 2000-054883 filed Feb. 29, 2000, the entire contents of which are hereby incorporated by reference.

What is claimed is:

1. A semiconductor memory device being capable of performing a self-refresh operation, comprising:

a first circuit having a non-volatile circuit and generating a first signal that specifies a first self-refresh cycle in accordance with a stored value in the non-volatile circuit;

a second circuit receiving an external signal in a test self-refresh operation mode via a terminal that is used to transmit another signal in a normal operation mode, the second circuit outputting a second signal that specifies a second self-refresh cycle in accordance with the external signal; and a third circuit receiving the first and the second signals and generating a pulse signal having the first self-refresh cycle to perform the self-refresh operation, and the third circuit generating a pulse signal having the second self-refresh cycle in the test self-refresh operation mode.

2. The semiconductor memory device as claimed in claim 1, wherein said third circuit comprises a counter, and one of the first and second signals is data related to a count value of said counter.

3. The semiconductor memory device as claimed in claim 1, wherein said third circuit comprises:

a count value setting circuit selecting one of count values respectively specified by the first and second signals; and a counter operating in accordance with a selected one of the count values.

4. The semiconductor memory device as claimed in claim 1, wherein said second circuit comprises a gate which outputs the second signal only when the semiconductor memory device receives a test signal supplied from an outside thereof.

5. The semiconductor memory device as claimed in claim 1, wherein said first circuit comprises a fuse.

6. The semiconductor memory device as claimed in claim 1, wherein said second circuit comprises a buffer.

7. The semiconductor memory device as claimed in claim 1, wherein the second signal includes an address signal.

8. The semiconductor memory device as claimed in claim 1, wherein said terminal receives the second signal from an outside of the semiconductor memory device.

9. The semiconductor memory device as claimed in claim 1, wherein the second signal comprises a plurality of address bits.

10. The semiconductor memory device as claimed in claim 1, wherein said first circuit comprises a plurality of fuses.

* * * * *